United States Patent [19]

Bayraktaroglu

[11] Patent Number: 4,673,958

[45] Date of Patent: Jun. 16, 1987

[54] MONOLITHIC MICROWAVE DIODES

[75] Inventor: Burhan Bayraktaroglu, Plano, Tex.

[73] Assignee: Texas Instruments Incorporated, Dallas, Tex.

[21] Appl. No.: 697,301

[22] Filed: Jan. 31, 1985

[51] Int. Cl.[4] .................. H01L 29/90; H01L 27/13; H01L 23/50; H01L 23/34

[52] U.S. Cl. ..................................... 357/13; 357/51; 357/81; 333/35; 333/247; 331/107 R

[58] Field of Search .................. 357/51, 81, 13; 333/247, 35, 238, 246; 331/107 R

[56] References Cited

U.S. PATENT DOCUMENTS

| | | | |
|---|---|---|---|
| 3,768,050 | 10/1973 | Stiles, Jr. ............................. | 333/35 |
| 4,035,830 | 7/1977 | Kim ..................................... | 357/81 |
| 4,152,718 | 5/1979 | Cachier ................................ | 357/81 |
| 4,200,880 | 4/1980 | Frey ..................................... | 357/51 |
| 4,283,734 | 8/1981 | Espaignol ............................ | 357/81 |
| 4,302,734 | 11/1981 | Stockton et al. ................... | 333/246 |
| 4,319,265 | 3/1982 | Rosen et al. ........................ | 357/13 |
| 4,331,942 | 5/1982 | Matsunaga et al. ................ | 333/35 |
| 4,374,394 | 2/1983 | Camisa ................................ | 357/81 |
| 4,376,287 | 3/1983 | Sechi ................................... | 357/81 |
| 4,544,989 | 10/1985 | Makabu et al. ...................... | 357/81 |

OTHER PUBLICATIONS

Cachier et al., IEEE Transactions on Microwave Theory and Techniques, vol. MTT-27, No. 5, May 1979 pp. 505-510.

Heitzmann, IEEE Transactions on Electron Devices, vol. ED-30 No. 7, Jul. 1983, pp. 759-763.

Caulton, "The Lumped Element Approach to Microwave Integrated Circuits" The Microwave Journal May 1970, pp. 51-58.

Pengelly "Microwave Field-Effect Transistors—Theory, Design and Applications" Copyright 1982 pp. 381-399.

Sokolov et al., 1979 IEEE MTT-S International Microwave Symposium Digest, Orlando, FL. USA pp. 489-491.

Primary Examiner—Andrew J. James
Assistant Examiner—John LaMont
Attorney, Agent, or Firm—Carlton H. Hoel; Robert O. Groover; Leo N. Heiting

[57] ABSTRACT

Two-terminal active devices, such as IMPATT and Gunn diodes, are combined with passive devices in a monolithic form using a plated metal heat sink to support the active elements and a coated-on dielectric to support the passive elements. Impedance-matching circuitry is preferably placed very close to (or partially overlapping) the active device, thereby eliminating detrimental device-to-circuit transition losses.

77 Claims, 19 Drawing Figures

MONOLITHIC MICROWAVE DIODES

BACKGROUND AND SUMMARY OF THE INVENTION

The present invention relates to microwave device integration.

At higher microwave frequencies (also known as millimeter frequencies, i.e. above 30 GHz up to about 300 GHz or higher) it is extremely difficult to achieve a compact source of rf power. Transistors of any sort are difficult enough to construct with even small-signal gain in the higher frequencies of this regime, and transistor oscillators are simply not capable of providing the needed power at higher frequencies. Thus, to provide an initial source of rf power (which can then be modulated, phase-shifted, attenuated, etc.), microwave diodes (such as IMPATTs, TRAPATTs, BARITTs, TUNETTs, or others) appear to be the only solid-state option for the foreseeable future.

However, integrating microwave diodes into functional circuitry for near-millimeter operation presents major problems, at which the present invention is aimed.

In common practice, microwave diodes are produced in discrete form rather than as integrated circuits, so that the device can be bonded to a good heat sink. (The power density dissipated in an advanced microwave diode is very high, particulary at higher microwave frequencies, and thermal coupling becomes a crucial design limitation. Gallium arsenide or other III-V substrates tend to be rather poor thermal conductors.) Heat sink materials are usually (preferably) highly conductive metals which also form the ground contact of the diode. Thus, in the prior art, a discrete semiconductor microwave diode would be assembled and bonded to a metal heat sink, and would then be bonded to connect it to impedance-matching passive elements off-chip.

However, this prior art approach has tremendous disadvantages. First, the bond-wire connections introduce unpredictable parasitic reactances, so that the resonance characteristics of a completed structure are not predictable in either center frequency or Q. Thus much more complicated circuit designs must be used at the module level to compensate for this unpredictability, and such expensive techniques as hand-adjustment of matching values and selection of matched sets of components must be used extensively. Second, the amount of hand labor required to produce a functional device is much greater than for any monolithic structure. Third, yield is greatly degraded, because the step of affixing a bond wire to a thin semiconductor chip is very likely to break the chip under pressure. Fourth, this major source of yield loss occurs at a very advanced stage of processing, i.e. the devices being destroyed are nearly completed, and thus their destruction is a greater loss than the destruction of an equal number of devices early in processing would be. Fifth, a particular difficulty of the prior art is that efficiently combining multiple diodes to achieve greater power output becomes even more difficult.

Many of these difficulties are inherent in the discrete device assembly process, and could be avoided if it were possible to build monolithic IMPATT diode structures. However, monolithic fabrication of these diodes for operation at higher microwave frequencies has heretofore not been possible, due to the incompatible processing requirements of heat sink materials and of on chip impedance-matching circuits. That is, the heat-sinking requirements of the active area demand that the active area be thermally extremely closely coupled to the heat sink, and in practice this means that the active area must be physically located on the heat sink. However the passive elements for impedance-matching must not be located so close to the heat sink (if the heat sink is conductive), or, at higher microwave frequencies, it will be impossible to configure an inductor: the parasitic capacitance to the substrate will make every element look like a capacitor. However, use of non-conductive heat sinks, such as diamond, is not practical for two terminal devices, such as IMPATT diodes, which require a good backside contact. Thus, there is an inherent conflict beween the needs of the active elements and passive elements which has heretofore precluded their integration in a single monolithic structure.

In some approaches previously considered, the thermal problem was addressed either by placing the heat sink metal inside fine vias produced in the GaAs substrate or by spreading the device area over a large surface and using the GaAs substrate as the heat sink. In both approaches the impedance matching circuity is produced on the semi-insulating part of the substrate. However, this is not optimal, because the heat sink capabilities of such configurations are limited, while the processing depends on the use of expensive technology.

An attempt was made at RCA laboratories to fabricate monolithic IMPATT diodes on silicon substrates (RCA Review, vol. 42, p. 633 (1981)). The method described makes use of selective etching of silicon and ion implantation through the thin portions of the wafer to achieve device active layers. Metallization of via holes and production of impedance matching circuitry on the silicon substrate was mentioned, but practical devices were not demonstrated. It is believed that the silicon slice could not be made resistive enough after all necessary implantations. No complete usable method of producing monolithic circuits was presented. Although silicon does have better thermal properties than gallium arsenide, this particular approach appears impracticable due to the other shortcomings of silicon as a substrate.

Figure 8A:
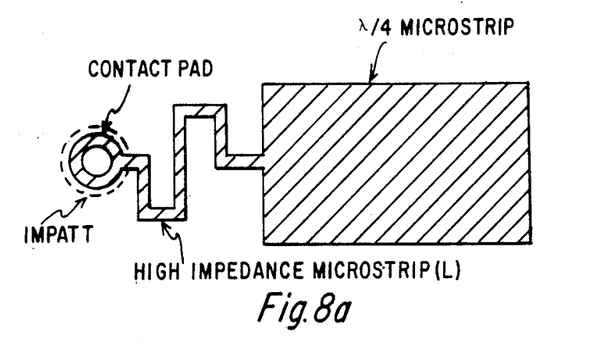
FIG. 8 shows the use of distributed elements on a monolithic diode structure to transform the impedance of the device to higher values so that the output power can be effectively coupled out of the device, and the alternative approach shown in FIG. 9 utilizes lumped elements to achieve broadband impedance matching.
Figure 8B:
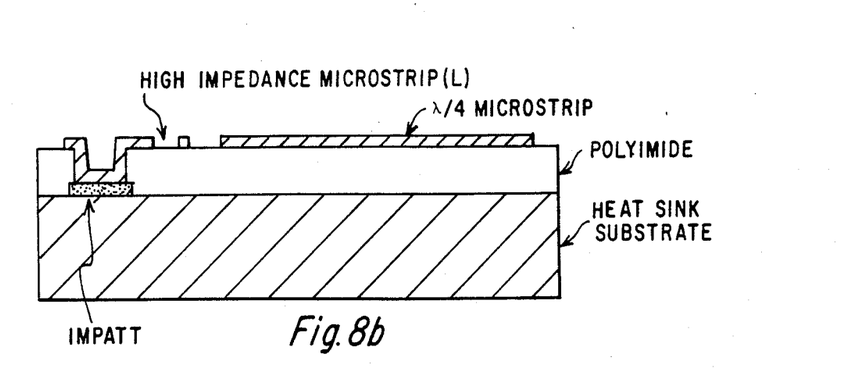
Figures 9A, 9B:
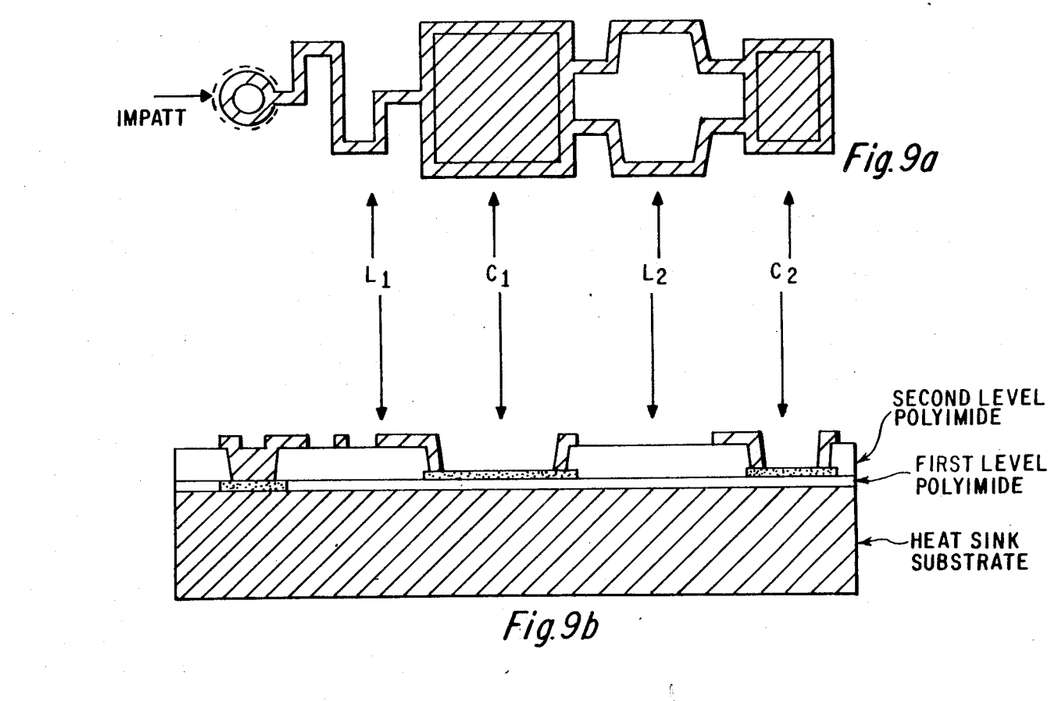

The present invention, in various embodiments, teaches the fabrication of monolithic microwave diodes, such as IMPATT diodes, produced on large-area metallic heat sink material which also serves as the ground terminal of the device. (The heat sink is plated onto the topside of the active layer of a chip, and the original semi-insulating substrate is then etched off.) The device protective packaging, device-to-circuit transitions and the impedance matching circuits are all produced with the use of varying thicknesses of coated-on dielectric (preferably polyimide) layers which are produced on the surface of the heat sink substrate. In this way, the polyimide layers become an integral part of the device, allowing the fabrication of monolithic circuits without the thermal disadvantages of a gallium arsenide substrate. FIGS. 8 and 9 show sample implementations of this concept. Polyimide is used as the dielectric medium over which impedance matching networks, transmission lines, and bias filters are produced. Electrical contact between the circuitry on polyimide and the IMPATT diode is provided by via holes in the polyimide layer directly above the diode. In this fashion the device is encapsulated inside a stable and durable dielectric, while device-to-circuit parasitics are reduced considerably, since the on-chip circuits are placed directly above the device. The thickness of the polyimide layer is typically 10 to 50 micrometers, the actual thickness depending on the particular application. The total device height, for an IMPATT to operate at the higher microwave frequencies of most interest, must not be more than a few micrometers. This is achieved by using a selective etching technique.

Thus, the present invention provides a fundamentally new structure for microwave devices. The use of a multilayer structure of polyimide (or other coated-on dielectric) over a metallic heat-sink ground plane permits the mounting of both the active area and of the matching passive elements to be optimized. Moreover, the polyimide provides a substrate of good enough quality that fairly conventional integrated circuit patterning and fabrication techniques can be used to build elements with high reproducibility.

Most advantageously, the present invention is used to combine any desired number of diodes having a common semiconductor layer structure with any desired combination of passive elements. Thus, power combining networks can be used to match multiple diodes; filter networks can be combined monolithically with a diode oscillator; or bias control networks for a VCO can be integrated with a diode oscillator. It should also be noted that the present invention does not preclude use of three-terminal active devices either, although two-terminal devices are easier to use with present invention.

The fabrication scheme used in the present technique minimizes the transition losses between elements, since inductive elements are produced on the second level and connections are made by vertical via holes directly above capacitors.

Another important advantage of the present invention is that it permits the manufacturing economies of fabricating a whole wafer of devices at a time to be applied to the processing of millimeter-wave IMPATTs, which has not heretofore been possible.

All capacitors are produced simultaneously on a thin layer of polyimide. Similarly, all inductors are produced simultaneously on a thick layer of polyimide. This means that for a given mask set, all capacitor and inductor values are proportional. Absolute values of capacitors and inductors are determined by relative thicknesses of polyimide layers which are produced separately. By varying the thicknesses of the two polyimide layers in proportion to each other, the center frequency of the impedance matching network can be adjusted over a large fraction of the bandwidth without significantly altering the circuit properties seen by the active device.

The thermal properties of a microwave diode can in general be improved if the active area of the device is spread over a larger area. That is, for a given total active area and substrate/heat-sink structure, the active area can dissipate higher power if it is configured as many separate small pieces, since the thermal spreading resistance of the substrate/heat-sink around the separate portions of the active area will lower the total thermal resistance seen by the total active area. Thus, for a given total active area it is desirable to use area-spreading techniques to get maximum power. However, this implies that the individual active area portions must be smaller, and this is a problem when using the techniques taught by the prior art. High frequency microwave devices are typically a few thousandths of an inch in diameter if produced in one piece. These small dimensions already impose severe limitations on the conventional processing technology. Spreading the active area of the device means that each piece of the device will be even smaller in area, which increases the difficulty of fabricating. However, the monolithic technology of the present invention is capable of processing much smaller geometries (accuracy down to 1 micron). Therefore the need, resulting from area spreading, for smaller area devices is not as severe a limitation as the case with conventional technology. The smallest piece of an active device can be at least one order of magnitude smaller that what is achievable today, and therefore are spreading is very greatly facilitated. Thus, the present invention provides greater area spreading (and therefore greater output power capability) for a given total active area.

The total area of an active device is determined by the external circuit capabilities. The maximum device area, and hence the output power, is determined (in the prior art) by the minimum circuit impedance levels which can be achieved by the external circuitry. Therefore, for a given circuit configuration the output power per device is fixed. However, in addition to the advantages of the present invention in area spreading, the minimum impedance level problem is also greatly mitigated by the present invention, since at least some impedance matching can be accomplished within the monolithic package. That is, parallel-connected IMPATT diodes having a net impedance of (for example) one quarter ohm could be impedance-transformed, using a passive-element network within the monolithic element, up to a level, such as ten or more ohms, which is easily matched to external impedance levels.

Output powers of several devices can be combined at the circuit level to increase total output power. (Power combining, as distinguished from area spreading, is usually used in the art to refer to this configuration, i.e. to combination of devices in the external circuitry as opposed to use of multiple active areas within a single device package.) While the present invention is particularly advantageous in solving the problems of area spreading, it is also advantageous in facilitating power combining, since the problems of matching to and bonding to the device package are so greatly reduced.

The capability of handling smaller area devices also implies that the monolithic technology of the present invention becomes even more advantageous as frequency is increased further. This is because the device sizes must be reduced as the frequency increases to keep device impedance levels constant. (Transit times decrease as the frequency increases. Drift region thicknesses decrease and consequently the capacitance per unit area increases. Reactive impedance equals the inverse of two pi times frequency times capacitance, and therefore admittance per unit area increases with frequency.) Above 100 GHz, the device sizes are prohibitively small (about 20 microns) for conventional technology, whereas the limitations on the monolithic technology of the present invention are not reached until above 300 GHz.

Another one of the difficulties of the prior art at high frequencies is to transform circuit impedances down to the device impedance levels. Two terminal devices such as IMPATTs generally produce larger output powers when the device impedance is allowed to go down, because the device negative resistance decreases sharply as the signal voltage grows in magnitude. The signal grows until the device negative resistance is equal to the external circuit resistance. In other words, the larger signal values will be obtained for smaller negative resistance conditions. One way to assure that the signal voltage grows to reasonable values is to restrict the device area so that the small signal impedance levels will be high. This of course reduces the power output capability of the diode. Device impedance levels less than one ohm are desirable, but are seldom reached in conventional technology due to manufacturing difficulties and the very complex circuit configurations required to compensate for parasitic circuit elements. The monolithic technology of the present invention overcomes these difficulties. The external elements are of conventional microstrip and lumped element type. Furthermore, the parasitic elements are almost totally eliminated, so that circuit impedance transformation can be achieved more easily and reproducibly.

Another advantage of the monolithic technology is the reproducibility achieved from device-to-device and from wafer-to-wafer. IMPATT diodes have negative conductances over a large frequency range, so that the diodes themselves are not inherently very frequency-selective, and the oscillation frequency is determined by the external circuit elements. Monolithic technology ensures that all circuit elements are nearly identical. This point has been demonstrated experimentally. In a 60 GHz design, a 1.6% variation in oscillation frequency under identical operating conditions was achieved over a 6 cm$^2$ wafer—about 400 devices. Yields are also very high as expected, typically 90%. This means that oscillators constructed according to the present invention will have an operating frequency as-fabricated which can be much more accurately predicted, so that much less hand-tuning and selection of matching components is necessary to configure good working systems.

One of the unique teachings of the present invention is that contact to the semiconductor diode elements is not made by external leads, but is made by deposited thin-film metallization. This point of novelty itself is a source of numerous advantages.

According to the present invention there is provided: A microwave device comprising: a metal heat sink; at least one semiconductor active element located on said metal heat sink; a coated dielectric overlying said semiconductor active device element, said coated dielectric containing at least one via hole above said active element; a thin film metallization pattern on said coated dielectric; and bond pad areas on said coated dielectric, said bond pad areas being connected by said thin film metallization through said via hole to said active element.

According to the present invention there is provided: A microwave device comprising: a metal heat sink; a plurality of semiconductor active elements located on said metal heat sinks; a coated dielectic overlying said semiconductor active device element, said coated dielectric containing a plurality of via holes above said active elements, and said dielectric laterally separating said semiconductor active elements so that said active elements are not within a common continuous body of semiconductor material; a thin film metallization pattern on said coated dielectric; and bond pad areas on said coated dielectric, said bond pad areas being connected by said thin film metallization through said via hole to said active element.

According to the present invention there is provided: A microwave device comprising: a metal heat sink; at least one semiconductor active element located on said metal heat sink; an organic dielectric overlying said semiconductor active device element, said dielectric containing at least one via hole above said active element; a thin film metallization pattern on said dielectric; and bond pad areas on said dielectric, said bond pad areas being connected by said thin film metallization through said via hole to said active element.

According to the present invention there is provided: A microwave device comprising: a metal heat sink; at least one semiconductor active element located on said metal heat sink; first and second layers of coated dielectric overlying said semiconductor active device element, said first layer of coated dielectric containing at least one via hole above said active element; thin film metallization on said coated dielectric layers; said thin film metallization defining capacitor plates on said first dielectric layer; bond pad areas on one of said dielectric layers, said bond pad areas being connected by said thin film metallization through said via hole to said active element.

BRIEF DESCRIPTION OF THE DRAWING

The present invention will be described with reference to the accompanying drawings, wherein:

FIGS. 10A and 10B show a sample embodiment of the present invention where area-spreading and impedance matching are accomplished in a two-layer structure.

FIGS. 11 and 12 show another sample embodiment of the invention.

A sample six element impedance matching network designed for matching to 1 -ohm loads is shown in FIG. 15.

DESCRIPTION OF THE PREFERRED EMBODIMENTS

Processing steps for a sample embodiment of the invention will now be described in great detail. Naturally this embodiment is merely exemplary, and the device and processing details can be widely varied.

Figure 1:
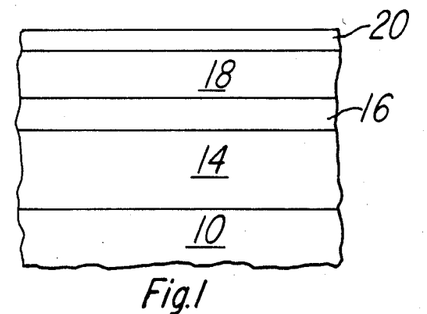
FIGS. 1–7 show successive stages in processsing a sample embodiment of the present invention.

FIG. 1 shows a semiconductor substrate on which the active device layers have been deposited by MBE or otherwise. For example, in this embodiment a GaAs substrate 10 has an AlGaAs etch stop layer 14 (for example one micron of Al(0.6)Ga(0.4)As), an n+ contact layer 16 (for example one half micron of GaAs doped to 1E19), a drift region 18 including p− and n− drift layers (for example, for 50 GHz operation, 400 nm of p− and 400 nm of n−, both doped to 1E17), and a p+ contact layer 20 (e.g. 0.2 microns of GaAs doped to 1E19). The drift region 18 can be a flat profile double-drift structure, as here, or can (more preferably) be a hybrid-Read profile instead. Both are conventional structures.)

Figure 2:
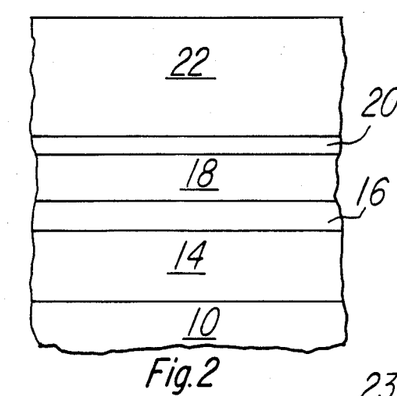

This semiconductor wafer is initially cleaned up to remove organic contaminants, and then a metal heat sink layer 22 is deposited, as shown in FIG. 2. For example, a sample embodiment evaporates 1000 A of platinum, followed by 4000 A of gold, onto semiconductor layer 20. This is then plated with gold for 16 hours at 17 mA (for a quarter of a two-inch slice). The plated surface is smoothed mechanically if necessary, to provide a good surface for thermal contact to heat sink packaging. The plated gold thickness will typically be about 6 mils, although this is not a critical parameter: the thickness of layer 22 only needs to be enough to provide mechanical support and heatsinking, and its thickness is limited only by the expense and yield loss of a very long plating step. Other metals with good conductivity, such as silver or copper, could be used instead: gold has the advantage of corrosion resistance, but has the disadvantage of higher cost.

The foregoing steps have resulted in the structure of FIG. 2. The metal layer 22 will now be made to serve as the substrate, and the semiconductor substrate 10 will be removed. First, the substrate 10 is preferably lapped down to about 7 mils total thickness, since this mechanical step provides an easy way to do initial thinning.

After the residue from lapping is removed (e.g. with cleanup in tetrachloroethylene followed by exposure to an oxygen plasma to remove organic contaminants), selective etching to remove the semiconductor substrate 10 can proceed. The wafer is mounted with metal layer 22 down on a silicon slice, and etched in a solution of H2O2 mixed with 5 percent of concentrated NH4OH solution for approximately 15 min. This etch removes the GaAs layer 10, but stops on the AlGaAs layer 14 if the Al mole fraction is high enough. The mole fraction (Al/Ga ratio) is preferably x=0.6 for reproducible results. This etchant is very sensitive to contamination. In addition, during etching all metal parts must be covered with a high quality wax. Otherwise, galvanic reactions will reduce the selectivity.

Figure 3:
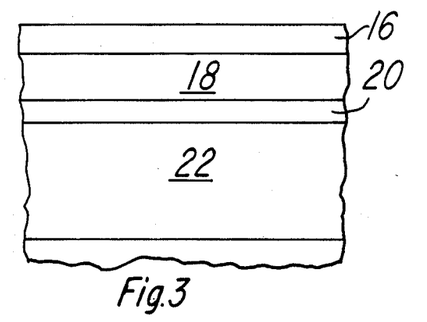

Next, the AlGaAs etch stop layer 14 is removed using a hydrofluoric acid wet etch (this etch will stop on GaAs). This results in the structure shown in FIG. 3.

Figure 4:
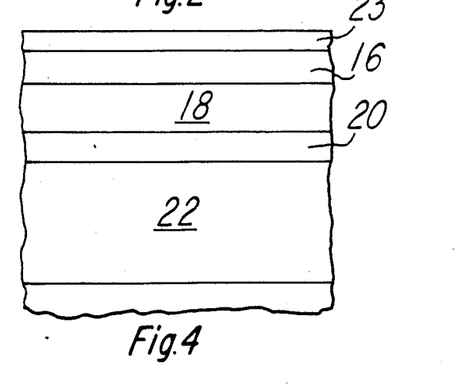

A short further wet GaAs etch is now preferably used to remove any contaminated surface layer from the contact layer 16. At this point a thin layer 23 of, e.g., 1000 A of evaporated Ti followed by 1000 A of gold is deposited. This metal combination may not be ideal for some purposes, but it is convenient for the following processing steps. Au and Ti can be removed rather easily in wet chemicals. Ti adheres to GaAs well, and Au keeps it from oxidizing and helps in electroplating later. These metals could be sputter deposited instead, or TiW followed by Au could be sputtered instead. This is a more desirable combination since TiW is a better barrier against Au diffusion (into GaAs). TiW can be removed easily as well. This results in the structure shown in FIG. 4.

Next, a patterning step opens up areas to be plated with thick gold which also defines the device area. This thick gold 25 is then used as the mask during mesa etching.

Figure 5:
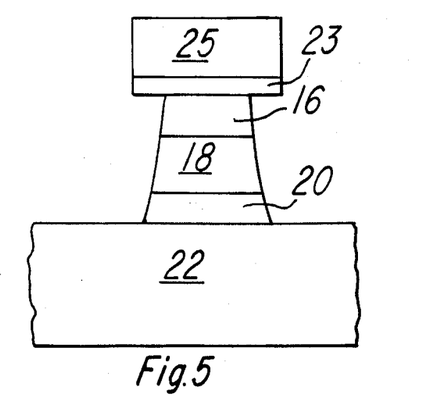

Next, all the evaporated metals 23 (Ti and Au, or TiW and Au) are removed from the wafer surface. Since the plated gold areas 25 have much thicker metallization they remain almost untouched. The plated gold thickness is typically 2 microns. A mesa etch can now be performed, using the plated gold as a hardmask, to define the separated active diode regions 27 within the remaining semiconductor layers 16, 18, and 20. Preferably an isotropic (wet) etch is used at this step, but a plasma etch could alternatively be used instead. However, it is desirable to use an etch will produce undercut so that the portions of gold hardmask 25 slightly overhang the semiconductor mesas, for reasons which will be discussed below. It is also (naturally) preferable that this etch not be orientation-dependent, so that the semiconductor mesas left are not faceted. This results in the structure shown in FIG. 5.

The plated gold layer 25 is preferably left in place, since it lowers the contact resistance when vias make contact to the top of the semiconductor mesa areas 27. It also permits evaporation of a metal adhesion layer 29, as will next be described, without shorting out the diode sidewalls, since the plated layer 25 shadows them during evaporation.

Next, a thin layer 29 of titanium (e.g. 500 A) is preferably evaporated. This simple step greatly facilitates processing when polyimide is used as the coated dielectric: polyimide adheres to Au or Pt rather well normally, but after going through all the above processing steps and after being exposed to solvents and chemicals, the metal surface is not reproducibly clean enough for polyimide to adhere with adequate reliability. Ti adheres to most things well. Also, since it is freshly evaporated, it has a good clean surface. Polyimide then can adhere reliably to the Ti layer 29. Other metals could be used in place of titanium at this stage: chromium also improves adhesion, or, more generally, any freshly evaporated metal could be used to provide a clean surface for adhesion. However, titanium is preferable. Due to the overhang of the gold hardmask portions 25, the metal layer 29 is not deposited on the sidewalls of the semiconductor mesas—in particular, not over the sidewalls of the drift region 18—since otherwise the diode operation would be shorted out.

Figure 6:
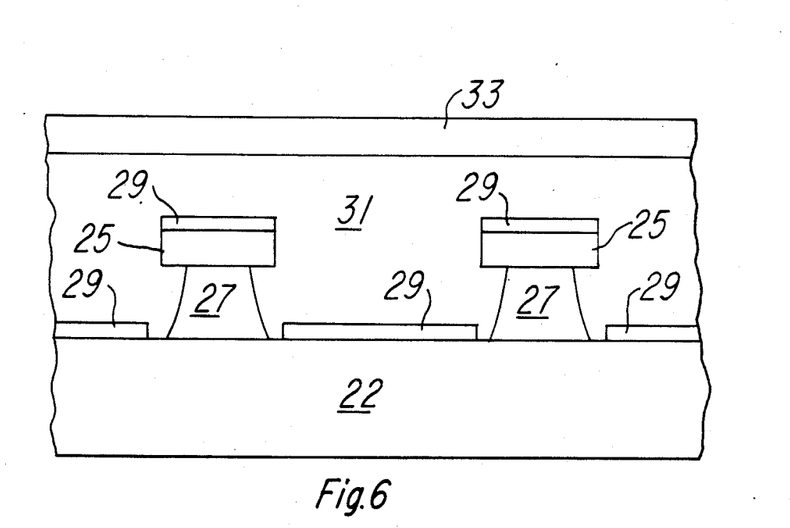

Polyimide (for example, polyimide PI 2550 from Dupont) is then spun on and cured, for example as follows: Air dry 2 min; ramp up to 80 C.; Bake at 100 C. for at least 1 hour; Ramp to 250 C., 1.5 hours total; ramp to 365 C., (30 min total). For example, approximately a ten micron layer 31 of polyimide would result from this step. To control the polyimide thickness, the spin rate can be varied, and more or less viscous polyimide compositions can be used. For example, to deposit a polyimide layer of about one micron (as the lower of two polyimide layers), polyimide PI2555 can be used instead. A thin layer 33 of silicon nitride is then deposited, e.g. by plasma CVD at 250 C. This results in the structure of FIG. 6.

The patterning step to define vias 35 above the active device areas 27 is now performed. The silicon nitride layer 33 provides a hardmask over the polyimide, so that the nitride 33 can be patterned with a short CF4/O2 etch and then used to mask an oxygen plasma RIE etch of the polyimide layer 31. Finally, the nitride hardmask 33 is preferably removed using a short wet etch. This etch removes any overhang of the nitride layer 33, which might shadow the metal deposition, and also removes the portion of the titanium layer 29 which is exposed at the bottom of the via. A short cleanup step (e.g. butyl acetate spray followed by a gold etchant, such as iodine and potassium iodide) is preferably used at this point, to ensure that a good contact can be formed to gold layer 25.

Figure 7:
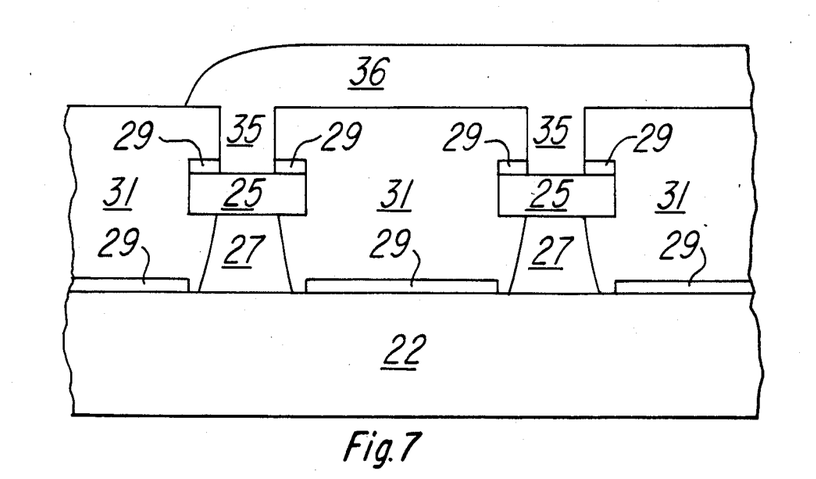

Next, a metallization layer 36 is applied. In the presently preferred embodiment, this is evaporated Ti followed by sputtered Au. (Sputtering at this stage is desirable to provide good metal coverage of the insides of the vias which have just been etched.) A resist layer is now applied and patterned, and the metallization layer 36 is thus patterned to form capacitors, transmission lines, and bond pads, in the finished structure shown in FIG. 7.

After fabrication has been completed, the wafer being processed can simply be cut apart with a sharp blade (such as a razor blade) to separate the multiple usable diode devices which have been formed by a single sequence of processing steps. Thus, another important advantage of the present invention is that it permits the manufacturing economies of fabricating a whole wafer of devices at a time to be applied to the processing of millimeter-wave IMPATTs, which has not heretofore been possible.

Any type of polyimide will work in this technology. Polyimide is a preferred polymer because it has good thermal and physical properties. Other polymers with similar properties can be considered. For example, fluorocarbon polymers (such as Teflon (TM)) produced in thin film form on the chip by plasma deposition techniques would be useful. Fluorocarbon is believed to be actually preferable to polyimide in many respects: it is a better dielectric, and more inert. A wide variety of other polymers, such as polystyrene, can also be used instead of polyimide. Alternatively, inorganic dielectrics such as SiO2, Si3N4 or others can be used if thick layers are produced (by plasma-assisted deposition) at low enough temperatures (e.g. less than 350 C.). In particular, optically enhanced chemical vapor deposition is particularly attractive in practising the present invention with inorganic dielectrics.

If water absorption of the polyimide becomes a problem, the polyimide layer can be encapsulated with another dielectric such as Si3N4 or fluorocarbon polymer. If the encapsulant layer is kept small compared to the polyimide thickness, it will not interfere with circuit design. Otherwise, composite dielectric properties must be used in the calculations.

In a two layer polyimide process, the first layer is first processed completely: e.g., spin on the polyimide (e.g. one micron thick), cure, metallize with Ti-Au, open up areas in photoresist, plate these areas, remove resist and evaporated metals. This forms the capacitors. Then the second coat of polyimide is spun on. Silicon nitride is used to define Reactive Ion Etch (RIE) areas. Vias are produced over the diode and the capacitors simultaneously. The plated Au top layer of the capacitors stop the etching just as does the top contact of the diode. The key process steps are as follows: 1. Diode formation; 2. Capacitors; 3. Vias to diodes and the capacitors; 4. Metallization and plating to form inductors, pads, etc. The silicon nitride is removed between steps 3 and 4. First level interconnects can also be used in a two layer process, although, if the first layer of coated dielectric is very thin, the distributed parasitic capacitance of first level interconnects is likely to be extremely high.

A specific example of a two layer structure will be described in more detail below. However, it should be noted that the present invention is not limited only to embodiments using one or two levels of coated-on dielectric: for example, one class of embodiments of the present invention use a three-level structure, wherein capacitors are formed on the first level, first-level interconnects on the second level, and inductors (i.e. high-impedance transmission line sections) and resistors and bond pads on the third level. It should also be noted that, in multi-layer embodiments of the invention, it is not necessary to make the layers of the same material: for example, the first layer can be made of a plasma-deposited material, such as fluorocarbon polymers, which has very good dielectric qualities, while the upper layer(s) is made from a spin-on dielectric such as polyimide.

One class of presently preferred embodiments of the invention teaches an IMPATT diode integrated with a lumped element impedance-matching network in polyimide, to which the off-chip bonding connections are made. Another whole class of embodiments, preferred for higher microwave and millimeter wave frequencies, teaches an IMPATT diode on the metal heat sink integrated with a distributed matching network in the polyimide. These two classes of embodiments of IMPATTs with on-chip thin-film matching, differing with respect to the type of on-chip matching used, will now be described in more detail.

In a series resonated oscillator the IMPATT device can be represented by a series connection of a negative resistance and a capacitor. For oscillation conditions to hold true, the total system impedance must be equal to zero at the frequency of oscillation. This requires that the device be presented with an impedance matching circuit that has the negative of device impedance. FIG. 8 shows the use of distributed elements to transform the impedance of the device to higher values so that the output power can be effectively coupled out of the device. The distributed element is of the form of one or more quarter-wave long sections of low characteristic impedance transmission lines. FIG. 8 illustrates the use of one section transformer, but up to 4 sections have been shown to give excellent results, and more sections can be used. To match the reactive part of the device impedance, a short, high impedance transmission line is inserted between the device and the transformer. This second element has the characteristics of an inductor if the line width is not larger than the dielectric thickness.

The alternative approach shown in FIG. 9 utilizes lumped elements to achieve broadband impedance matching. The inductive elements are formed by high impedance microstrip lines produced on thick polyimide layers, as discussed above. The capacitive elements are in the form of MIM capacitors formed on a thin first layer of polyimide. As seen in FIG. 9 all capacitors are sandwiched between two polyimide layers. Electrical connections are made to capacitors using vias produced directly above them. The biggest advantage of this approach over the first one is that the physical size is much smaller. For applications where broadband impedance matching is essential, such as distributed IMPATT amplifiers, this approach will be preferable.

Figure 14A:
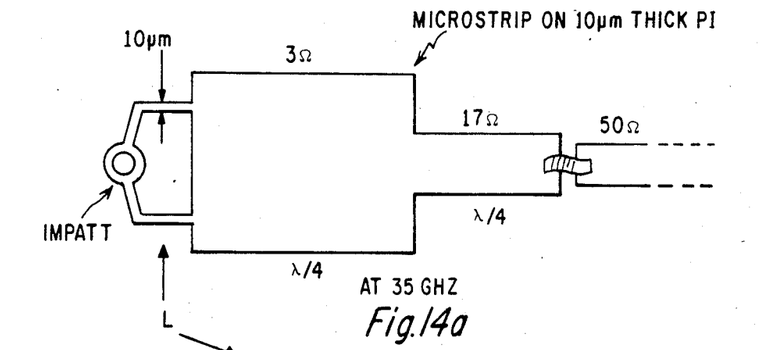
FIG. 14 shows a sample chip layout and its equivalent circuit.
Figure 14B:
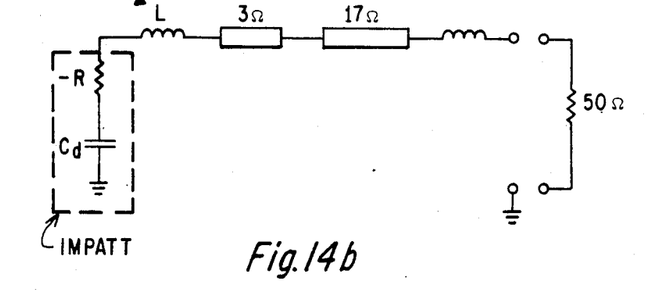

Quarter-wave transmission line impedance transformers are commonly used in microwave designs, but their application to monolithic circuits is somewhat limited due to real estate restrictions. In millimeter-wave frequencies the wavelength and consequently the size of the transformers are reduced, making their widespread use economical. The feasibility of this approach has been demonstrated with excellent results. The chip layout and the equivalent circuit are shown in FIG. 14. In this Figure a two-stage transformer is shown. The state-of-the-art conversion efficiencies obtained indicate the importance of reducing transition parasitics and highlights the advantages of monolithic fabrication approaches used.

Figure 15:
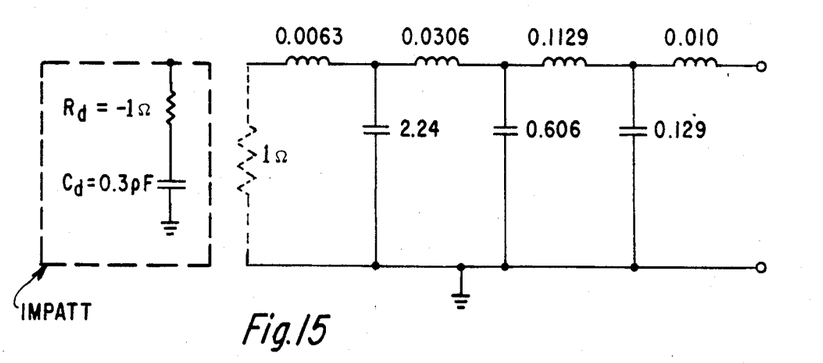

A six element impedance matching network designed for matching to 1-ohm loads is shown in FIG. 15. The capacitors are formed on a one micrometer thick first polyimide layer, whereas the inductors are formed on a ten micrometer thick second polyimide layer, as discussed above. The design bandwidth is 40%, covering the entire Q-band of frequencies. For oscillator applications, an inductor connected between the device and the impedance matching network will be necessary to resonate the reactive part of the device impedance.

The advantages of this type of impedance matching network are manyfold. The most important one is that the total area required for a broadband impedance matching circuit is only a fraction of the area required for distributed element impedance matching. The fabrication scheme used in the present technique minimizes the transition losses between elements, since inductive elements are produced on the second level and connections are made by vertical via holes directly above capacitors.

All capacitors are produced simultaneously on a thin layer of polyimide. Similarly, all inductors are produced simultaneously on a thick layer of polyimide. This means that for a given mask set, all capacitor and inductor values are proportional. The absolute values of lumped capacitors and of the inductors (which are sections of high-impedance transmission line: the impedance of stripline varies as width over height, where height is the distance separating the strip from the ground plane of inductors) are determined by the relative thicknesses of the two polyimide layers, which are produced separately. By varying the thicknesses of the two polyimide layers in proportion to each other, the center frequency of the impedance matching network can be shifted without sacrificing bandwidth.

Figure 10A:
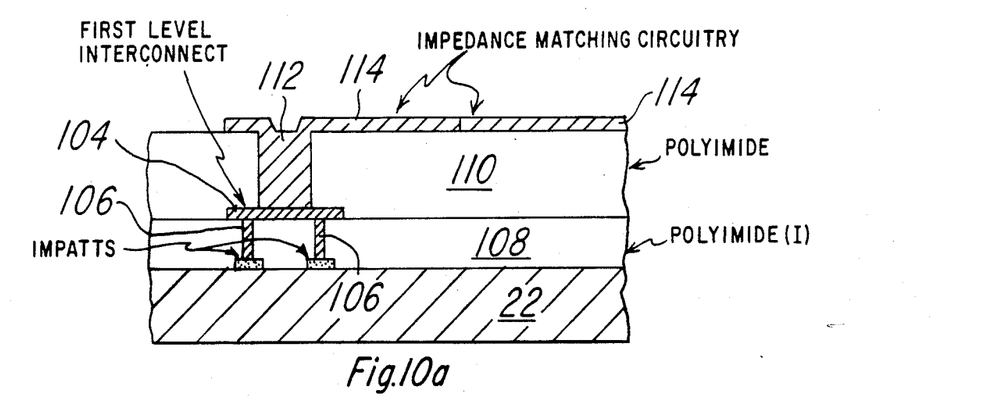

FIG. 10 shows a sample embodiment of the present invention where area-spreading and impedance matching are accomplished in a two-layer structure. Multiple IMPATT diodes 102 are formed on a metal substrate 22, and are connected in parallel by a first-level interconnect 104. The interconnect 104 is connected to each diode by a first-level via 106. Since the first polyimide level 108 is preferably much thinner than the second polyimide layer 110, the first-level via 106 can be smaller than the second-level vias 112. The second-level vias make connection to impedance matching circuitry and bond pads in metallization 114.

Figure 10B:
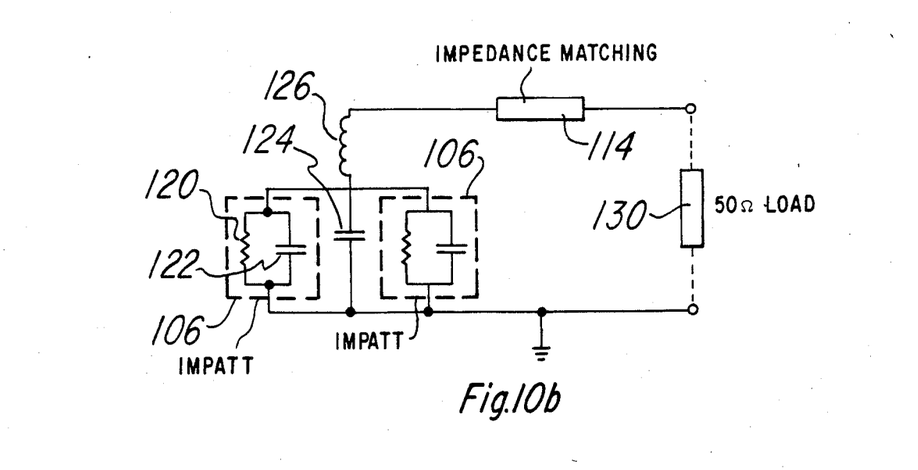
FIG. 10B shows an equivalent circuit diagram of the structure shown in FIG. 10A.

FIG. 10B shows an equivalent circuit diagram of the structure shown in FIG. 10A: the IMPATTs 106 are each represented as a parallel connection of a capacitance 122 and a negative resistance 120. The capacitance between interconnect 104 and ground is shown as 124, and the parasitic via inductance is shown as 126. Circuitry 114 impedance-matches this structure to (presumably off-chip) load impedance 130.

Figure 13:
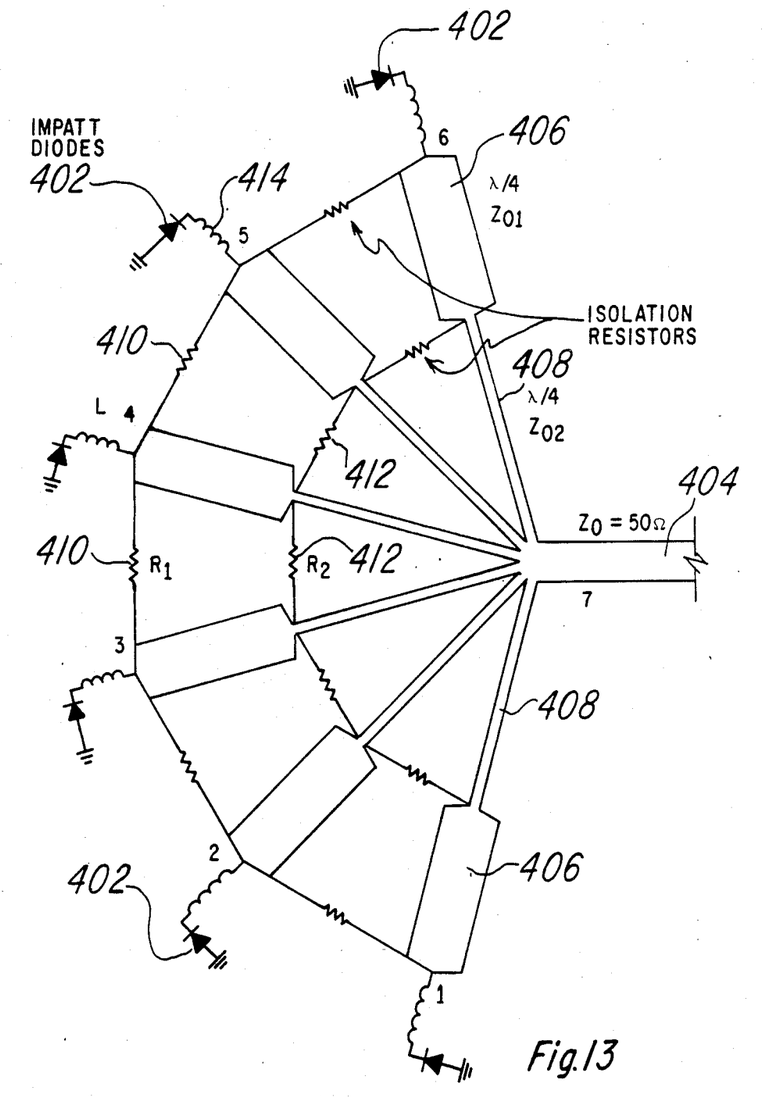
FIG. 13 shows another sample embodiment of the invention, where multiple diodes 402 (each of which preferably contains multiple semiconductor mesas in parallel, using area-spreading as discussed above, e.g. like that shown in FIG. 10) are power-combined on-chip and impedance-matched to provide a high-power high-frequency 50 -ohm output.

FIG. 13 shows another sample embodiment of the invention, where multiple diodes 402 (each of which preferably contains multiple semiconductor mesas in parallel, using area-spreading as discussed above, e.g. like that shown in FIG. 10) are power-combined on-chip and impedance-matched to provide a high-power high-frequency 50-ohm output. Power-combining and impedance-matching is accomplished by: appropriately designed impedance mathing networks that are in effect connected in parallel with a common output, i.e. 50 ohm line, and a set of isolation resistors to ensure stability of combining. For example, the power combining shown in FIG. 13 is accomplished by using high impedance transmission lines 414, connected directly to the diodes, which act as inductors cancelling the reactive component of diode impedance. A two section impedance matching network is then used to lower the real part of the circuit impedance down to 1 ohm level near the diode. In the determination of the values of characteristic impedance of transmission lines, it is taken into account that these transmission lines are connected in parallel. In the given example the transmission lines 406 and 408 would be approximately quarter-wave long and have characteristic impedances of 4.2 ohms for the first section 406, and 72 ohms for the second section 408. The isolation resistors 410 and 412 are connected between the transmission lines at each transformation section. These resistors form an equalizing path for the out-of-phase components of the combined power. The absolute values of resistors are chosen to offer the highest possible isolation between devices, while the power handling capability of each resistor is dictated by the individual device power and the total power of the combiner. This last provision ensures a graceful degradation in the case of failure of one or more of the devices. Sample isolation resistor values are 2.75 ohm for the first stage 410, and 6.7 ohm for the second stage 412, where the impedance and the power of the diodes in the power combining are 1 ohm and 3 W each.

The resistors used, for example, in FIG. 13 are preferably thin-film resistors, fabricated on the topmost layer of circuit elements if a multi-element structure is being used. For example, these could be made of evaporated gold over titanium, 1000 A over 1000 A. The capability to make thin-film resistors integrated in the device package is another important advantage of the present invention.

Figure 11A:
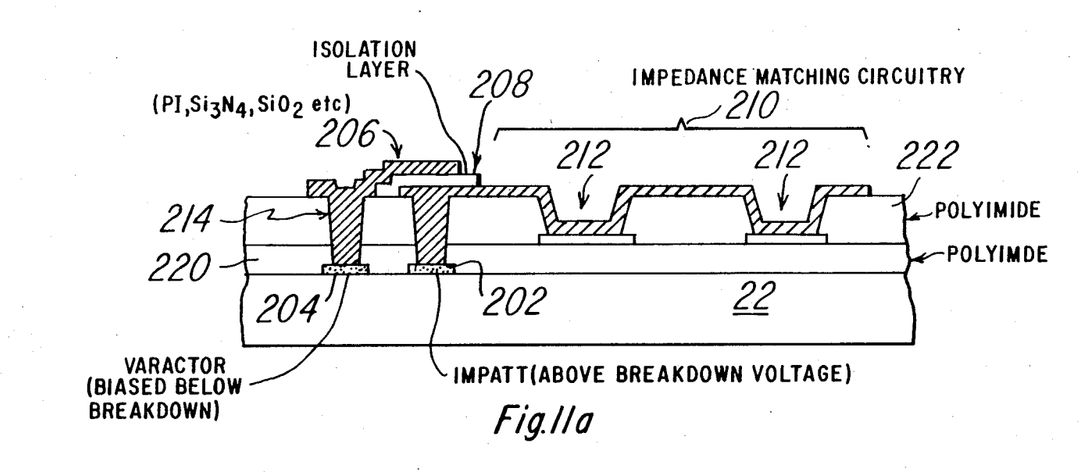
FIGS. 11A and 11B show a sample voltage-controlled monolithic IMPATT oscillator device structure and its equivalent circuit.
Figure 11B:
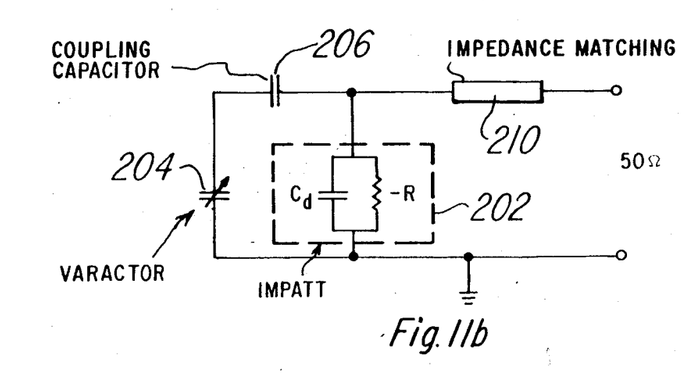
Figure 12:
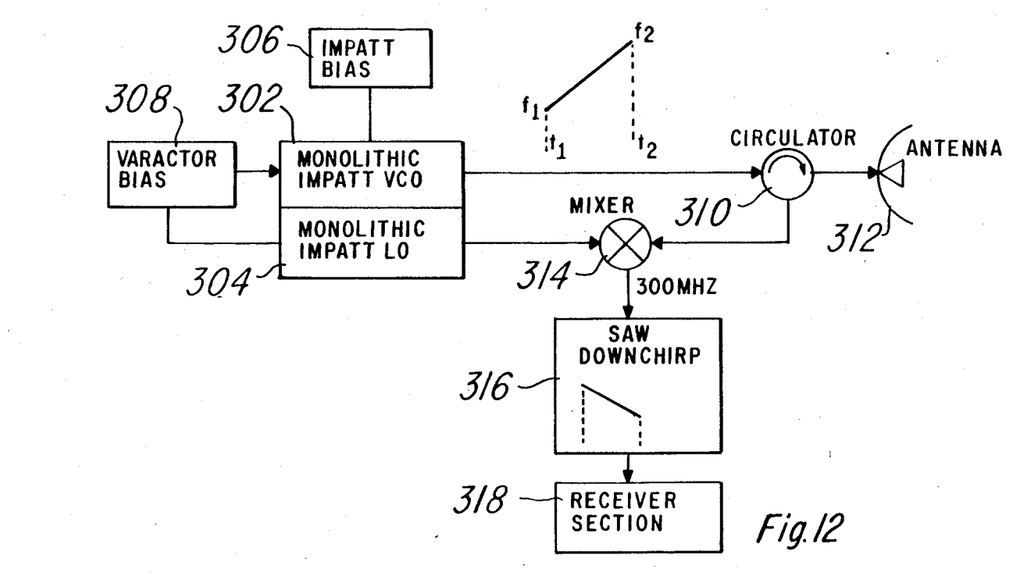
FIG. 12 shows an example of the use of this structure in a sample system embodiment.

FIGS. 11 and 12 show another sample embodiment of the invention. FIGS. 11A and 11B show a sample voltage-controlled monolithic IMPATT oscillator device structure and its equivalent circuit, and FIG. 12 show an example of a pulse-compression radar system according to the present invention which uses such a device structure.

In FIG. 11A, semiconductor mesas 202 and 204 all have a layer structure suitable for operation as IMPATT diodes, and are commonly located on a heat-sink metal substrate 22. However, mesas 202 are biased above their breakdown voltage, so that they operate as IMPATT diodes, whereas the mesa(s) 204 are biased below breakdown using an externally controlled variable bias voltage so that they function as varactors. Vias 214 connect the IMPATTs 202 and varactors 204 to a coupling capacitor 206, which preferably is an MIM capacitor having a large capacitance. Note that this capacitor includes a thin interlayer dielectric 208, which can be $SiO_2$, $Si_3N_4$, polyimide, or other dielectrics. Impedance matching circuits 210 connect the IMPATT output to a standard 50 ohm load. Note that these Z-matching circuits 210 include capacitors 212 formed on first coated dielectric layer 220, as well as other elements (not separately shown) formed on second dielectric layer 222.

FIG. 12 shows the use of this structure in a sample system embodiment. A monolithic IMPATT VCO 302 and a monolithic IMPATT local oscillator 304, and optionally also mixer 314, are preferably (but not necessarily) integrated, using the above technology, on the same substrate. An IMPATT bias supply provides the necessary dc input voltage for IMPATT operation, while a varactor bias supply 308 changes the capacitance of varactors 204 so that the IMPATT VCO sends a chirped signal through circulator 310 to antenna 312. Return signals from antenna 312 go through circulator 310 to a mixer 314, which downconverts the received signal by mixing it with the output of local oscillator 304. The downconverted signal is then downchirped by SAW downchirp section 316, to provide a single pulse output corresponding to a single scatterer, and provided to receiver section 318.

The present invention makes such systems much more attractive, since the frequency of the IMPATT oscillators 302 and 304 is much more easily predictable and reliably controlled. Moreover, fabrication of the actual connections to the circuit lines leading to IMPATT oscillator 310 and mixer 314 is greatly simplified, since no bond wires or ribbons needs to be attached to the actual semiconductor diode structure, but can be attached to bond pads on a polyimide package instead. The fabrication of the VCO, the LO and the mixer in the same chip simplifies the fabrication, enables the operation of VCO and LO at frequencies very close to each other (which is important since the downconverted signal needs to be as low a frequency as possible), and reduces the transmission line paths and parasitics associated with interconnecting stage that would otherwise would be necessary. The innovative feature of combning an IMPATT LO and an IMPATT VCO on one monolithic chip enables one to have a matched pair of diodes, whose properties (including temperature drift, frequency spectrum, etc.) are very similar. Since we are mixing these very high frequencies to obtain a difference frequency that is about 0.3% of the original frequency, it is important to have a matched pair of diodes. Otherwise, a lot of tuning will be necessary.

Further advantages of systems configured according to the present invention include: the reliability of the system is enhanced, since the semiconductor diode elements are encapsulated in a dielectric, which enhances the environmental protection capabilities of the system designer. Moreover, system design is greatly simplified since the external circuitry does not have to match very low impedances: the oscillators 302 and 304 can match to 50 ohms on-chip, or can at least transform their low internal impedances up to a level such as ten ohms which is relatively easy to match to. Moreover, the system of FIG. 12 according to the present invention can operate at frequencies of 94 GHz and above, which was simply impossible for analogous system configurations in the prior art.

In addition to these system advantages, the present invention also provides fundamental innovations, yielding major advantages, in microwave device structures and their processing, as discussed above.

As will be apparent to those skilled in the art, the present invention teaches a fundamental innovation in the art of microwave devices and device packaging, and can be incorporated within a tremendous range of modifications and variations. The present invention is believed to be of fundamental novelty, and accordingly its scope is expressly not limited by the details of any of the specific embodiments set forth in the foregoing.

What is claimed is:
1. A microwave device comprising:
a metal heat sink:
at least one semiconductor active element located on said metal heat sink:
a planar coated dielectric layer overlying said semiconductor active device element and said heat sink, said dielectric layer containing at least one via hole above and extending down to said active element; and
a thin film metallization pattern on said dielectric layer, said thin film metallization pattern including a portion in said via hole and contacting said active element and including a portion forming a segment of a transmission line in conjunction with said metal heat sink and said dielectric.

2. A microwave device comprising:
a metal heat sink;
a plurality of semiconductor active elements located on said metal heat sink;
a planar coated dielectric layer overlying said semiconductor active device elements and said heat sink, said dielectric layer containing a plurality of via holes above and extending down to said active elements, and said dielectric layer laterally separating said semiconductor active elements so that said active elements are not within a common continuous body of semiconductor material; and
a thin film metallization pattern on said dielectric layer, said thin film metallization pattern including portion in said via holes and contacting said active elements and including a portion forming a segment of a transmission line in conjunction with said metal heat sink and said dielectric.

3. A microwave device comprising:
a metal heat sink;
at least one semiconductor active element located on said metal heat sink;
an planar organic dielectric layer overlying said semiconductor active device element and said heat sink, said dielectric layer containing at least one via hole above and extending down to said active element; and
a thin film metallization pattern on said dielectric layer, said thin film metallization pattern including a portion in said via and contacting said active element and including a portion forming a segment of a transmission line in conjunction with said metal heat sink and said dielectric.

4. A microwave device comprising:
a metal heat sink;
at least one semiconductor active element located on said metal heat sink;
first and second planar layers of coated dielectric overlying said semiconductor active device element and said heat sink, said first layer of dielectric containing at least one via hole above and extending down to said active element; and
thin film metallization including portions on said second dielectric layer and on portions of said first dielectric layer under said second dielectric layer, said thin film metallization pattern including a portion in said via hole and contacting said active element and including a portion forming a segment of a transmission line in conjunction with said metal heat sink and said dielectric layers.

5. A microwave device comprising:
a semiconductor microwave diode with a first heavily-doped semiconductor region directly mounted on a metal heat sink, said heat sink also electrical ground;
a planar layer of dielectric on said heat sink and overlying said diode;
at least one bond pad on said layer to which a wire from an external circuit element may be connected; and
thin film metallization on said layer connecting the second heavily-doped semiconductor region of said diode through a via hole in said layer to said bond pad.

6. A voltage-controlled oscillator comprising:
a metal heatsink;
a plurality of semiconductor portions located on said heatsink and mutually separated;
a coated dielectric encapsulating said semiconductor portions on said heat sink;
thin film metallization on said dielectric, said metallization making electrical connection to said semiconductor portions through vias, said metallization including means for connecting a first bias voltage to first ones of said semiconductor portions and a second bias voltage to second ones of said semiconductor portions;
coupling capacitor means for rf-connectng sand dc-isolating said first ones of said semiconductor regions from said second ones of said regions; and
transmission line segments and reactive elements formed with conductors being portions of said metallization, ground being said heat sink and insulation being said dielectric, said transmission line segments and reactive elements providing connections to and impedance matching for said second regions;
whereby said first ones of said regions may be biased to operate as varactors and said second ones of said regions biased to operate as IMPATTs, so that the oscillation frequency of said second regions is at least partially determined by the bias voltage applied to said first regions.

7. A microwave device comprising:
a metal heat sink;
at least one semiconductor active element located on said metal heat sink;
first, second and third layers of coated dielectric overlying said semiconductor active device element, said first layer of dielectric containing at lest one via hole above said active element;
thin film metallization on said dielectric layers; said thin film metallization defining first capacitor plate on said first dielectric layer with second capacitor plates being said heat sink and capacitor insulator being said first dielectric layer, interconnects on said second dielectric layer, and bond pad areas on said third dielectric layer, said bond pad areas being connected by transmission line segments and reactive elements formed with conductors being portions of said metallization, ground being said heat sink and insulation being one of the group consisting of said first dielectric layer, said first and second dielectric layers and said first, second and third dielectric layers, said transmission line segments and reactive elements providing connections through said via hole to and impedance matching for said active elements.

8. The device of claim 1, wherein said heatsink comprises gold.

9. The device of claim 2, wherein said heatsink comprises gold.

10. The device of claim 3, wherein said heatsink compirses gold.

11. The device of claim 4, wherein said heatsink comprises gold.

12. The device of claim 5, wherein said heatsink comprises gold.

13. The device of claim 6, wherein said heatsink comprises gold.

14. The device of claim 7, wherein said heatsink comprises gold.

15. The device of claim 1, further comprising thin-film resistors fabricated on said coated dielectric.

16. The device of claim 2, further comprising thin-film resistors fabricated on said coated dielectric.

17. The device of claim 3, further comprising thin-film resistors fabricated on said coated dielectric.

18. The device of claim 4, further comprising thin-film resistors fabricated on said coated dielectric.

19. The device of claim 5, further comprising thin-film resistors fabricated on said coated dielectric.

20. The device of claim 6, further comprising thin-film resistors fabricated on said coated dielectric.

21. The device of claim 7, further comprising thin-film resistors fabricated on said coated dielectric.

22. The device of claim 4, further comprising first-level interconnects on said first dielectric layer, said first-level interconnects being connected to metallization on said second dielectric layer through via holes.

23. The device of claim 1, further said thin film metallization includes impedance-matching network elements configured to provide an output impedance higher than the impedance of said active elements.

24. The device of claim 1, wherein said thin film metallization includes power-combining network elements.

25. The device of claim 2, wherein said thin film metallization includes impedance-matching network elements configured to provide an output impedance higher than the impedance of said active elements.

26. The device of claim 2, wherein said thin film metallization includes power-combining network elements.

27. The device of claim 3, wherein said thin film metallization includes impedance-matching network elements configured to provide an output impedance higher than the impedance of said active elements.

28. The device of claim 3, wherein said thin film metallization includes power-combining network elements.

29. The device of claim 4, wherein said thin film metallization includes impedance-matching network elements configured to provide an output impedance higher than the impedance of said active elements.

30. The device of claim 4, wherein said thin film metallization includes power-combining network elements.

31. The device of claim 5, wherein said thin film metallization includes impedance-matching network elements configured to provide an outoput impedance higher than the impedance of said active elements.

32. The device of claim 5, wherein said thin film metallization includes power-combining network elements.

33. The device of claim 6, wherein said thin film metallization includes impedance-matching network elements configured to provide an output impedance higher than the impedance of said active elements.

34. The device of claim 6, wherein said thin film metallization includes power-combining network elements.

35. The device of claim 7, wherein said thin film metallization includes impedance-matching network elements configured to provide an output impedance higher than the impedance of said active elements.

36. The device of claim 7, wherein said thin film metallization includes power-combining network elements.

37. The device of claim 4, comprising capacitors fabricated on said first dielectric layer and other passive elements on said second dielectric layer.

38. The device of claim 4, wherein at least one of said dielectric layers comprises polyimide.

39. The device of claim 3, wherein said dielectric layer comprises a material selected from the group consisting of polyimide, polystyrene, and polyfluorocarbons.

40. The device of claim 1, further comprising an encapsulation layer above said thin film metallization except at locations of said bond pads.

41. The device of claim 2, further comprising an encapsulation layer above said thin film metallization except at locations of said bond pads.

42. The device of claim 3, further comprising an encapsulation layer above said thin film metallization except at locations of said bond pads.

43. The device of claim 4, further comprising an encapsulation layer above said thin film metallization except at locations of said bond pads.

44. The device of claim 5, further comprising an encapsulation layer above said thin film metallization except at locations of said bond pads.

45. The device of claim 6, further comprising an encapsulation layer above said thin film metallization except at locations of said bond pads.

46. The device of claim 7, further comprising an encapsulation layer above said thin film metallization except at locations of said bond pads.

47. The device of claim 4, further comprising an intermediate dielectric layer between said first and second dielectric layers, said intermediate layer comprising a different material than that of said first and second dielectric layers.

48. The device of claim 4, wherein said first dielectric layer comprises a fluorocarbon polymer.

49. The device of claim 4, wherein said first dielectric layer comprises a fluorocarbon polymer and said second dielectric layer comprises polyimide.

50. A microwave system comprising
an integrated microwave diode structure, wherein said diode structure contains thin-film metallization on a dielectric layer which is on a conductive heat sink, said metallization, dielectric layer and heat sink forming transmission line segments and reactive elements which connect a semiconductor active element to bond pads, and said transmission line segments and reactive elements configure impedance-matching elements:
a plurality of external microwave circuit elements; and
means for connecting said diode structure to ones of said external microwave circuit elements.

51. A microwave system comprising
an integrated microwave diode structure, wherein said diode structure contains thin film metallization on a dielectric layer which is on a conductive heat sink, said metallization dielectric layer and heat sink forming transmission line segments and reactive elements which connect a semiconductor active element to bond pads;
a plurality of external microwave circuit elements; and
means for connecting said diode structure, through lead wires or ribbons bonded to ones of said bond pads, to said external microwave circuit elements.

52. The system of claim 51, wherein said diode structure includes a plurality of semiconductor elements connected in parallel.

53. The system of claim 51, wherein said semiconductor elements comprise IMPATT diodes.

54. The system of claim 51, wherein said diode structure includes a plurality of said semiconductor elements and a power-combining network connected to combine the outputs of said semiconductor elements.

55. The system of claim 51, wherein said diode structure is an oscillator having an output frequency in the range between 30 and 300 gigahertz.

56. The system of claim 51, wherein said diode structure is a voltage-controlled oscillator having an output frequency in the range between 30 and 300 gigahertz.

57. The system of claim 51, wherein said external circuit elements include a circulator.

58. The system of claim 51, wherein said external circuit elements connect the output of said diode structure to an antenna, but no power amplification stages are interposed between the output of said diode structure and said antenna, and wherein said diode structure has an output frequency in excess of 30 GHz.

59. The system of claim 51, comprising a plurality of said diode structures configured to operated as oscillators, and wherein said external circuit elements comprise a power-combining network connected to combine the outputs of said oscillators.

60. The system of claim 51, wherein said external network comprises a plurality of phase-shifting elements.

61. The system of claim 51, wherein said impedance-matching circuits on said diode structure provide an output impedance of at least ten ohms.

62. The system of claim 51, wherein said external circuit elements comprise an impedance-matching network, and wherein said impedance-matching circuits on said diode structure provide an output impedance of at least ten ohms.

63. The system of claim 51, wherein said diode structure includes both a voltage-controlled oscillator and a local oscillator monolithically integrated.

64. The system of claim 51, wherein said diode structure includes a voltage-controlled oscillator, a local oscillator, and a mixer, all monolithically integrated.

65. The system of claim 52, wherein said diode structure includes a plurality of semiconductor elements connected in parallel.

66. The system of claim 52, wherein said semiconductor elements comprise IMPATT diodes.

67. The system of claim 52, wherein said diode structure includes a plurality of said semiconductor elements and a power-combining network connected to combine the outputs of said semiconductor elements.

68. The system of claim 52, wherein said diode structure is an oscillator having an output frequency in the range between 30 and 300 gigahertz.

69. The system of claim 52, wherein said diode structure is a voltage-controlled oscillator having an output frequency in the range between 30 and 300 gigahertz.

70. The system of claim 52, wherein said external circuit elements include a circulator.

71. The system of claim 52, wherein said external circuit elements connect the output of said diode structure to an antenna, but no power amplification stages are interposed between the output of said diode structure and said antenna, and wherein said diode structure has a output frequency in excess of 30 GHz.

72. The system of claim 52, comprising a plurality of said diode structures configured to operated as oscillators, and wherein said external circuit elements comprise a power-combining network connected to combine the outputs of said oscillators.

73. The system of claim 52, wherein said external network comprises a plurality of phase-shifting elements.

74. The system of claim 52, wherein said impedance-matching circuits on said diode structure provide an output impedance of at least ten ohms.

75. The system of claim 52, wherein said external circuit elements comprise an impedance-matching network, and wherein said impedance-matching circuits on said diode structure provide an output impedance of at least ten ohms.

76. The system of claim 52, wherein said diode structure includes both a voltage-controlled oscillator and a local oscillator monolithically integrated.

77. The system of claim 52, wherein said diode structure includes a voltage-controlled oscillator, a local oscillator, and a mixer, all monolithically integrated.

* * * * *